United States Patent
Chang

(10) Patent No.: US 8,502,255 B2
(45) Date of Patent: Aug. 6, 2013

(54) LIGHT EMITTING DIODE

(75) Inventor: Kuo-Cheng Chang, Miao-Li (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 108 days.

(21) Appl. No.: 13/300,662

(22) Filed: Nov. 21, 2011

(65) Prior Publication Data
US 2013/0126887 A1    May 23, 2013

(51) Int. Cl.
*H01L 33/00* (2010.01)

(52) U.S. Cl.
USPC ............... 257/98; 257/99; 257/100

(58) Field of Classification Search
USPC ............................ 257/98, 99, 100
See application file for complete search history.

(56) References Cited

U.S. PATENT DOCUMENTS

| 2009/0001400 A1* | 1/2009 | Kim et al. ............ 257/98 |
| 2009/0224278 A1* | 9/2009 | Nagai ............... 257/99 |

\* cited by examiner

*Primary Examiner* — Tan N Tran
(74) *Attorney, Agent, or Firm* — Altis Law Group, Inc.

(57) ABSTRACT

An LED includes a seat and an LED chip. The seat includes a main body, a first electrode protruding upwardly from the main body, and a second electrode formed on the main body. The LED chip includes a substrate, a first semiconductor layer disposed on the substrate, a light-emitting layer disposed on the first semiconductor layer, a second semiconductor layer disposed on the light-emitting layer, and a third electrode fixed on the second semiconductor layer. The first electrode extends through the substrate and electrically connects with the first semiconductor layer, and the third electrode electrically connects with the second electrode via a wire.

10 Claims, 3 Drawing Sheets

LIGHT EMITTING DIODE

BACKGROUND

1. Technical Field

The disclosure relates to light emitting diodes (LEDs) and, more particularly, relates to an improved LED having a single lead.

2. Description of Related Art

Presently, LEDs are preferred for use in non-emissive display devices than CCFLs (cold cathode fluorescent lamp) due to their high brightness, long lifespan, and wide color range.

A typical LED includes a seat, an LED chip disposed on the seat and an encapsulation material encapsulating the LED chip. The LED chip has two electrodes for being electrically connected to outer electrodes formed on the seat. The two electrodes of the LED chip are generally connected to the outer electrodes of the seat via two leads, respectively. However, in assembly of the LED, the lead, which is usually made of a golden wire, is so thin that it is prone to be broken. Using the two leads raises the risk of failure of the LED.

What is needed, therefore, is an LED which has a single lead.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
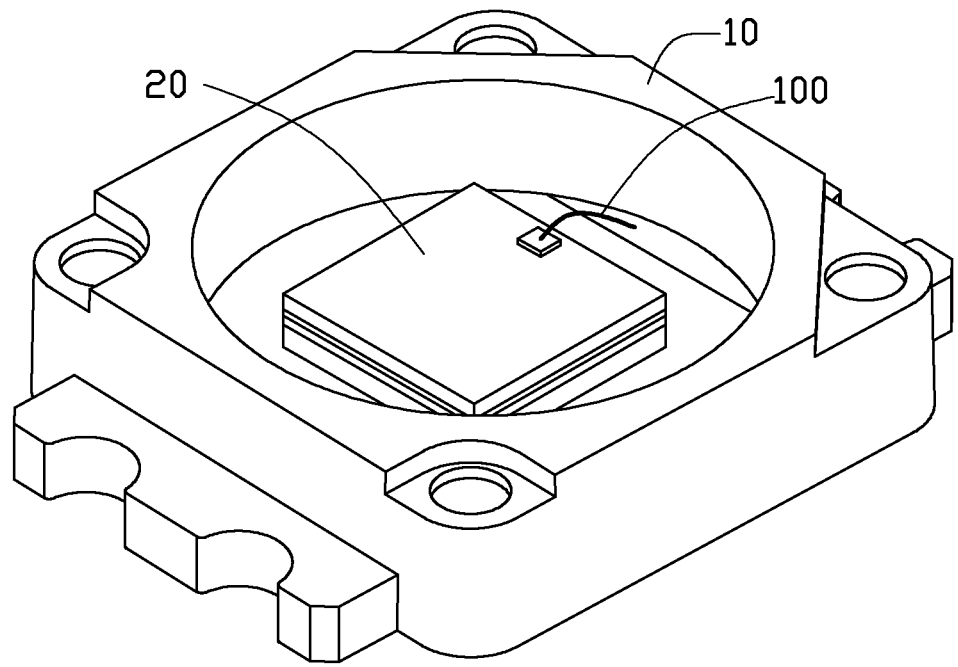
FIG. 1 is an isometric, assembled view of an LED in accordance with an embodiment of the disclosure.

Referring to FIG. 1, a light emitting diode (LED) in accordance with an embodiment of the disclosure is illustrated. The LED comprises a seat 10 and an LED chip 20 disposed on the seat 10.

Figure 2:
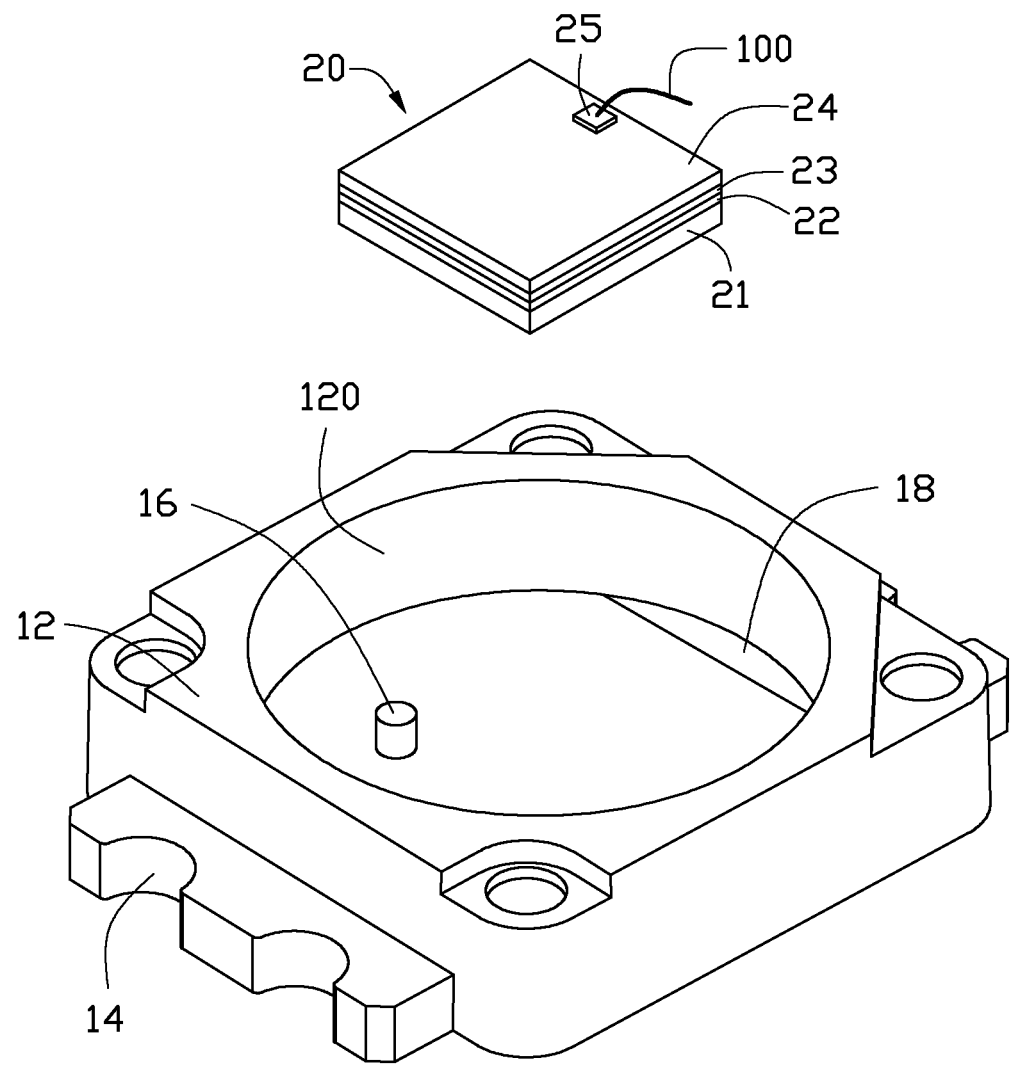
FIG. 2 is an exploded view of the LED of FIG. 1.
Figure 3:
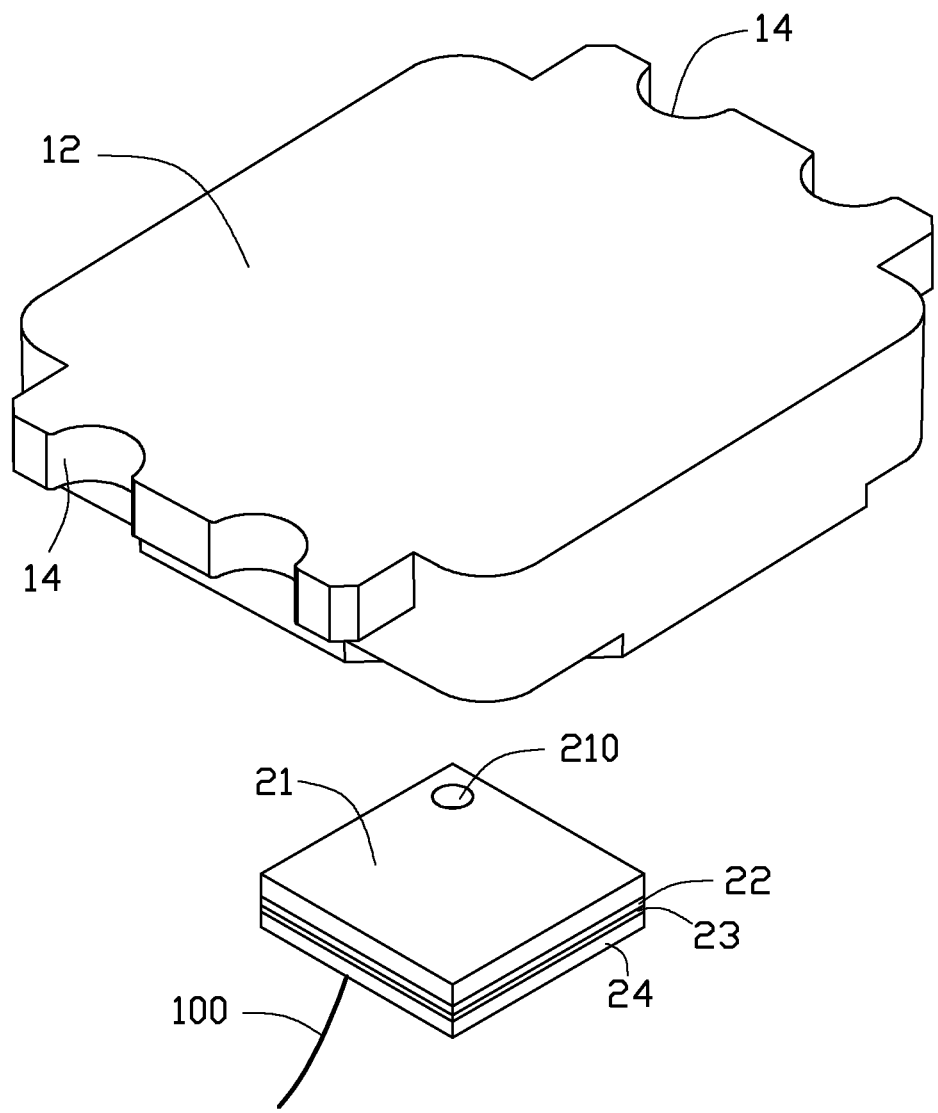
FIG. 3 is an inverted, exploded view of the LED of FIG. 1.

Referring to FIGS. 2-3 also, the seat 10 comprises a main body 12 and two electrical feet 14 extending outwardly from two opposite lateral sides of the main body 12, respectively. A top face of the main body 12 is concaved downwardly to form a depression 120. The depression 120 has a flat face on which the LED chip 20 is attached. The seat 10 further comprises a first electrode 16 and a second electrode 18 formed on the flat face of the depression 120. The first electrode 16 is insulatingly spaced from the second electrode 18. The first electrode 16 and the second electrode 18 electrically connect with the electrical feet 14, respectively. The first electrode 16 is columnar and extends perpendicularly and upwardly from the flat face of the depression 120. The first electrode 16 directly connects with the LED chip 20.

The LED chip 20 comprises a substrate 21, a first semiconductor layer 22 disposed on the substrate 21, a light-emitting layer 23 disposed on the first semiconductor layer 22, a second semiconductor layer 24 disposed on the light-emitting layer 23, and a third electrode 25 fixed on the second semiconductor layer 24. The third electrode 25 is connected to the second electrode 18 via a lead 100. The lead 100 is made of a golden wire. The substrate 21 is selected from sapphire, silicon carbide, lithium aluminate, lithium gallate, silicon, gallium nitride, zinc oxide, aluminum zinc oxide, gallium arsenide, gallium phosphide, gallium antimonide, indium phosphide, indium arsenide, zinc selenide, or metal. The substrate 21 defines a through hole 210 extending perpendicularly through the substrate 21 to expose a part of the first semiconductor layer 22. The first electrode 16 correspondingly extends through the through hole 210 of the substrate 21 and directly and electrically connects with the first semiconductor layer 22. In the embodiment of this disclosure, the LED chip 20 is made of a Group III-V semiconductor material, the first semiconductor layer 22 is an N-type semiconductor layer, and the second semiconductor layer 24 is a P-type semiconductor layer, the light-emitting layer 23 is sandwiched between the N-type semiconductor layer and the P-type semiconductor layer.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED (light emitting diode) comprising:
    a seat comprising a main body, and a first electrode and a second electrode formed on the main body; and
    an LED chip attached on the main body, the LED chip comprising a substrate, a first semiconductor layer disposed on the substrate, a light-emitting layer disposed on the first semiconductor layer, a second semiconductor layer disposed on the light-emitting layer, and a third electrode fixed on the second semiconductor layer;
    wherein the first electrode extends through the substrate and electrically connects with the first semiconductor layer, and the third electrode electrically connects with the second electrode;
    wherein the substrate of the LED chip defines a through hole extending through the substrate; and
    wherein the first electrode extends through the through hole of the substrate, and directly connects with the first semiconductor layer.

2. The LED as described in claim 1, wherein a top face of the main body is concaved downwardly to form a depression, and the depression has a flat face on which the LED chip is attached.

3. The LED as described in claim 2, wherein the first electrode protrudes upwardly from the face of the depression into the LED chip.

4. The LED as described in claim 3, wherein the first electrode is columnar.

5. The LED as described in claim 1, wherein the first electrode is insulatingly spaced from the second electrode.

6. The LED as described in claim 1, wherein the seat further comprises two electrical feet extending outwardly from two opposite lateral sides of the main body, respectively.

7. The LED as described in claim 6, wherein the first electrode and the second electrode electrically are connected to the two electrical feet, respectively.

8. The LED as described in claim 1, wherein the LED chip is made of a Group III-V semiconductor material, the first semiconductor layer is an N-type semiconductor layer, and the second semiconductor layer is a P-type semiconductor layer.

9. The LED as described in claim 1, wherein the substrate is made of a material selected from a group consisting of sapphire, silicon carbide, lithium aluminate, lithium gallate, silicon, gallium nitride, zinc oxide, aluminum zinc oxide, gallium arsenide, gallium phosphide, gallium antimonide, indium phosphide, indium arsenide, zinc selenide, or metal.

10. The LED as described in claim 1, wherein the second electrode electrically connects to the third electrode via a lead.

\* \* \* \* \*